United States Patent
Saito

(10) Patent No.: US 7,331,442 B2
(45) Date of Patent: Feb. 19, 2008

(54) CHIP COMPONENTS FEEDING APPARATUS

(75) Inventor: Koji Saito, Gunma (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 124 days.

(21) Appl. No.: 11/239,955

(22) Filed: Sep. 29, 2005

(65) Prior Publication Data

US 2006/0070848 A1    Apr. 6, 2006

(30) Foreign Application Priority Data

Sep. 29, 2004    (JP)    ............................ 2004-283340

(51) Int. Cl.
*H05K 13/02*    (2006.01)
(52) U.S. Cl. ........................ 198/389; 406/28
(58) Field of Classification Search ................ 198/389, 198/390, 540, 406; 221/278; 406/133, 28
See application file for complete search history.

(56) References Cited

U.S. PATENT DOCUMENTS

| | | | |
|---|---|---|---|
| 3,163,234 A * | 12/1964 | Boyer | 171/17 |
| 4,135,684 A * | 1/1979 | Willey | 406/13 |
| 5,385,434 A * | 1/1995 | Quinn et al. | 406/73 |
| 5,993,117 A * | 11/1999 | Lancaster et al. | 406/3 |
| 6,390,736 B2 * | 5/2002 | Rassman, Jr. et al. | 406/180 |
| 6,443,669 B2 * | 9/2002 | Saito | 406/28 |
| 7,051,900 B2 * | 5/2006 | Reeves | 221/200 |
| 2004/0004085 A1 * | 1/2004 | Williams et al. | 221/278 |
| 2004/0159669 A1 * | 8/2004 | Pollard et al. | 221/278 |

FOREIGN PATENT DOCUMENTS

| | | | |
|---|---|---|---|
| FR | 2589087 A3 * | 4/1987 | |
| JP | 2004-200491 | 7/2004 | |

* cited by examiner

*Primary Examiner*—Mark A. Deuble
(74) *Attorney, Agent, or Firm*—Knobbe Martens Olson & Bear LLP

(57) ABSTRACT

A chip components feeding apparatus is provided to be able to lessen a push load applied to a leading electronic part from succeeding electronic chip component to favorably take out the leading electronic part even in the case where a residual pressure phenomenon occurs in a conveyance passage. Since a chip component conveyance tube is provided with an ascending portion, in which an air flow based on an action of negative pressure causes electronic chip component to move climbing against dead weight, it is possible to restrict a pushing force applied to electronic chip component forwardly from those electronic chip component in the ascending portion, which are acted by dead weight, to lessen a push load applied to a leading electronic part by succeeding electronic chip component even in the case where a residual pressure phenomenon occurs in a conveyance passage including a chip component conveyance tube when the action of negative pressure is released.

7 Claims, 6 Drawing Sheets

CHIP COMPONENTS FEEDING APPARATUS

BACKGROUND OF THE INVENTION

1. Field of the Invention

The present invention relates to a chip components feeding apparatus that aligns chip component, which have a predetermined shape and are put in a bulk state, in a predetermined orientation and conveys the chip component after alignment to a predetermined take-out position, and more particular, to a chip components feeding apparatus using a tube as means for conveyance of the chip component after alignment to a take-out position, and making use of an air flow based on an action of negative pressure, as power for conveyance.

2. Description of Related Art

JP-A-2004-200491 filed by the applicant of the present application is known to disclose a chip components feeding apparatus using a tube as means for conveyance of chip component after alignment to a take-out position, and making use of an air flow based on an action of negative pressure, as power for conveyance.

The chip components feeding apparatus disclosed in the JP-A-2004-200491 comprises a chip component alignment unit functioning to align chip component, which have a predetermined shape and are put in a bulk state, in a predetermined orientation to discharge the same from an outlet, and a chip component take-out unit functioning to stop the chip component supplied to an internal chip component passage in an aligned state to expose a leading part outside through a chip component take-out outlet, the outlet of the chip component alignment unit being connected to a rear end of the chip component passage of the chip component take-out unit by means of a chip component conveyance tube. Provided in the chip component take-out unit is an air intake path to apply negative pressure in the chip component conveyance tube through the internal chip component passage, an end of the air intake path being connected to an air cylinder as a negative pressure generation source.

In case of making use of an air flow based on an action of negative pressure, as power for conveyance, a phenomenon occurs, in which an interior of a conveyance passage including a chip component conveyance tube is not returned to atmospheric pressure and succeeding chip components are put in a state of pushing preceding chip components even when the action of negative pressure is released. Such phenomenon is also called residual pressure phenomenon and liable to occur as a passage shape of a chip component conveyance tube and a size of chip component become small.

When such residual pressure phenomenon occurs, succeeding chip component apply a push load on a leading part and the leading part is put in a state of being interposed between a chip component stoppage portion and a second chip component, so that a taking-out miss is generated when a suction nozzle is used to take out a leading part from a chip component take-out outlet.

In order to dissolve interposition of a leading part due to the residual pressure phenomenon, there are tested a method of displacing a chip component stoppage portion slightly forward when a leading part is to be taken out, and a method of holding succeeding chip component so as to make the same immovable, in combination with the former method, but it cannot be said that the former method is sufficient to dissolve interposition since even when the chip component stoppage portion is displaced forward, succeeding chip component advance further than such displacement. Of course, interposition can be dissolved when such displacement is considerably increased, but such design cannot be practically adopted since a chip component taking-out position (a position of a leading part) is varied greatly. Also, the latter method cannot be said to be sufficient to dissolve interposition since succeeding chip component advance against a holding force.

SUMMARY OF THE INVENTION

The invention has been thought of in view of the situation and has its object to provide a chip components feeding apparatus that can lessen a push load applied to a leading part from succeeding chip component, to enable favorably taking out the leading part even in the case where a residual pressure phenomenon occurs in a conveyance passage including a chip component conveyance tube.

In order to attain the object, the invention provides a chip components feeding apparatus that aligns chip component, which have a predetermined shape and are put in a bulk state, in a predetermined orientation and then conveys the chip component to a predetermined take-out position through a chip component conveyance tube and making use of an air flow based on an action of negative pressure, wherein the chip component conveyance tube is provided with an ascending portion, in which an air flow based on an action of negative pressure causes chip component to move climbing against dead weight.

With the chip components feeding apparatus, since the ascending portion, in which an air flow based on an action of negative pressure causes chip component to move climbing against dead weight, is provided on the chip component conveyance tube, it is possible to restrict a pushing force applied to chip component forwardly of those chip component in the ascending portion, which are acted by dead weight, to lessen a push load applied to a leading part by succeeding chip component even in the case where a residual pressure phenomenon occurs in a conveyance passage including a chip component conveyance occurs tube when the action of negative pressure is released.

According to the invention, it is possible to lessen a push load applied to a leading part from succeeding chip component, to favorably take out the leading part even in the case where a residual pressure phenomenon occurs in a conveyance passage.

The object, other objects than that, constructional features, functions, and effects of the invention will become apparent from the following descriptions and the accompanying drawings.

DESCRIPTION OF THE PREFERRED EMBODIMENTS

Figure 1:
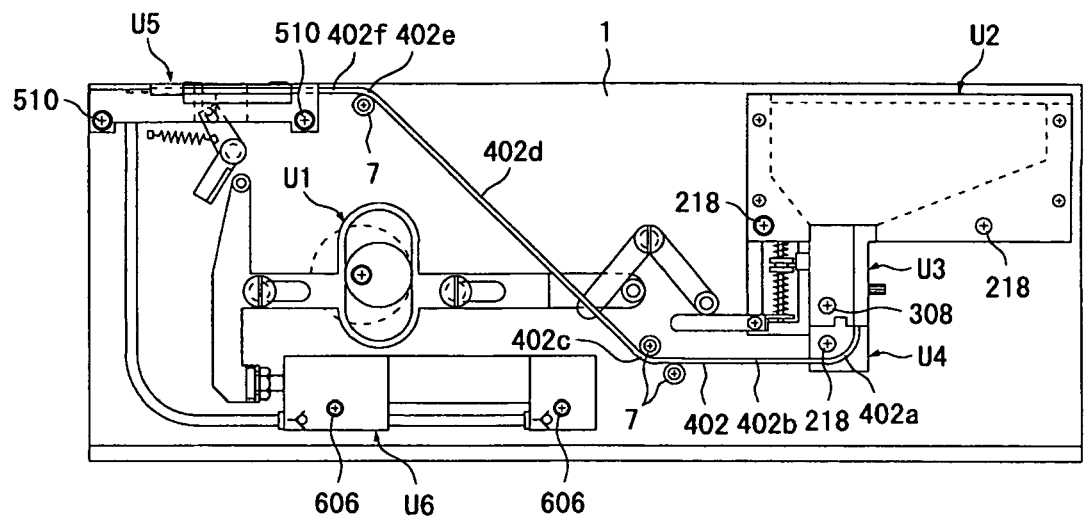
FIG. 1 is a left side view showing a chip components feeding apparatus according to an embodiment of the invention.

FIGS. 1 to 8 show an embodiment of the invention, and in the following descriptions, the left side, the right side, front side, and the back side in FIG. 1 are represented as front, rear, left, and right.

First, the construction of a chip components feeding apparatus will be described.

The chip components feeding apparatus shown in FIG. 1 comprises a frame 1, a drive unit U1, a chip component storage unit U2, a chip component alignment unit U3, a tube mount unit U4, a chip component take-out unit U5, and a negative pressure generation unit U6.

Figure 2:
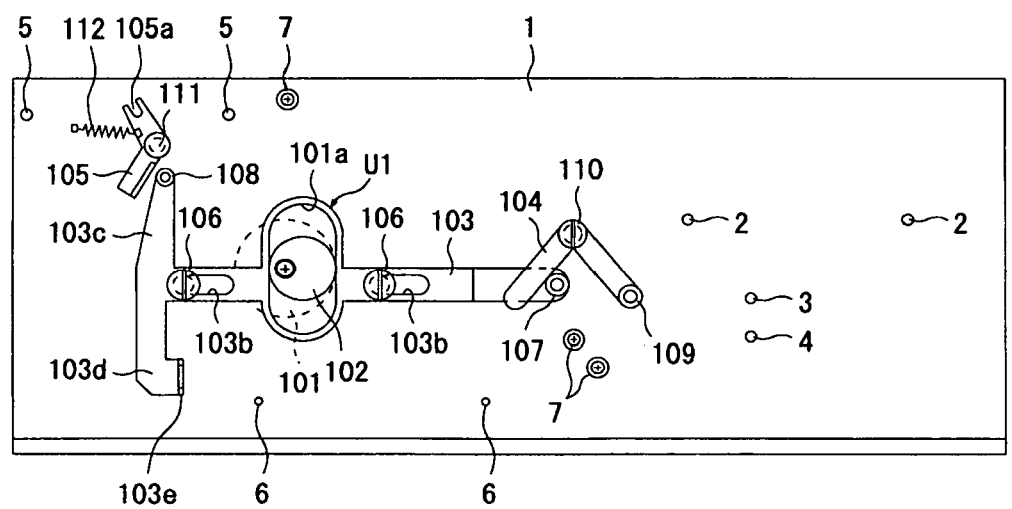
FIG. 2 is a view showing the chip components feeding apparatus, shown in FIG. 1, with a chip component storage unit, a chip component alignment unit, a tube mount unit, a chip component take-out unit, and a negative pressure generation unit removed.

As shown in FIG. 2, the frame 1 is L-shaped in cross section, and a vertical surface portion thereof is provided with two threaded holes 2 for mount of the chip component storage unit U2, a single threaded hole 3 for mount of the chip component alignment unit U3, a single threaded hole 4 for mount of the tube mount unit U4, two threaded holes 5 for mount of the chip component take-out unit U5, and two threaded holes 6 for mount of the negative pressure generation unit U6. Three tube holders 7 are provided on a left side surface of the vertical surface portion to arrange a chip component conveyance tube 402 in a predetermined configuration.

As shown in FIG. 2, the drive unit U1 comprises a motor 101 with a reduction gear, fixed to a right side surface of the vertical surface portion of the frame 1, a circular-shaped cam plate 102 fixed in an eccentric state to that shaft (not denoted by any numeral reference) of the motor 101, which extends through the vertical surface portion to project from the left side surface of the vertical surface portion, and a first lever 103, a second lever 104, and a third lever 105, which are arranged on the left side surface of the vertical surface portion.

The first lever 103 includes a vertical, elliptical cam hole 101a positioned substantially centrally thereof to receive therein the cam plate 102, and transverse, elliptical guide holes 103b on both sides of the cam hole. The first lever 103 is arranged on the left side surface of the vertical surface portion of the frame 1 by inserting flanged support shafts 106, respectively, into the two guide holes 103b and screwing male threaded ends (not shown) of the respective support shafts 106 into threaded holes (not shown) provided in the vertical surface portion of the frame 1. A roller 107 that transmits power to the second lever 104 is provided at a rear end of the first lever 103, a roller 108 that transmits power to the chip component take-out unit U5 is provided on a portion 103c, which is provided on an upper side of a front end of the first lever 103, and a grooved connection piece 103e being connected to a rod 602 of the negative pressure generation unit U6 is formed integral with a portion 103d, which is provided on a lower side of the front end of the first lever 103. Rotation of the cam plate 102 by the motor 101 in a predetermined direction enables the first lever 103 to move along the guide holes 103b in a longitudinal direction.

The second lever 104 is generally L-shaped, and a roller 109 that transmits power to the chip component alignment unit U3 is provided at an end of a rear portion of the second lever. The second lever 104 is arranged on the left side surface of the vertical surface portion of the frame 1 by inserting a flanged support shaft 110 into a hole (not shown) provided centrally thereof and screwing a threaded end (not shown) of the support shaft 110 into a threaded hole (not shown) provided in the vertical surface portion of the frame 1, and a front portion of the second lever is pushed by the roller 107 on the rear side of the first lever 103 to be able to turn clockwise in FIG. 2 and to be able to turn counterclockwise in FIG. 2 upon release of push.

The third lever 105 is generally L-shaped and provided at an end of an upper portion thereof with an engagement groove 105a, which transmits power to the chip component take-out unit U5. The third lever 105 is arranged on the left side surface of the vertical surface portion of the frame 1 by inserting a screw 111 into a hole (not shown) provided centrally thereof and screwing a threaded end (not shown) of the screw into a threaded hole (not shown) provided in the vertical surface portion of the frame 1. A spring 112 is provided between an upper portion of the third lever 105 and the left side surface of the vertical surface portion of the frame 1 to bias the third lever 105 counterclockwise in FIG. 2. The third lever 105 is pushed at a lower portion thereof by the roller 108 on a front side of the first lever 103 to be able to turn clockwise against the bias of the spring 112 in FIG. 2 and to be able to turn counterclockwise in FIG. 2 owing to the bias of the spring 112 upon release of push. Incidentally, since a gap is provided between the upper portion of the third lever 105 and the roller 108 on the front side of the first lever 103 to adjust timing of push, the third lever 105 is pushed at the lower portion thereof after the lapse of a predetermined period of time after the first lever 103 begins to advance.

Figure 3:
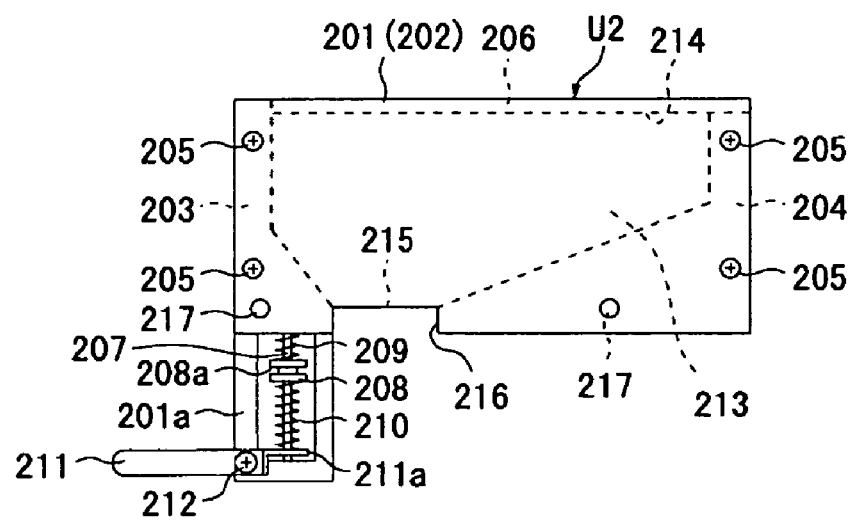
FIG. 3 is a view showing the construction of the chip component storage unit shown in FIG. 1.
Figure 4:
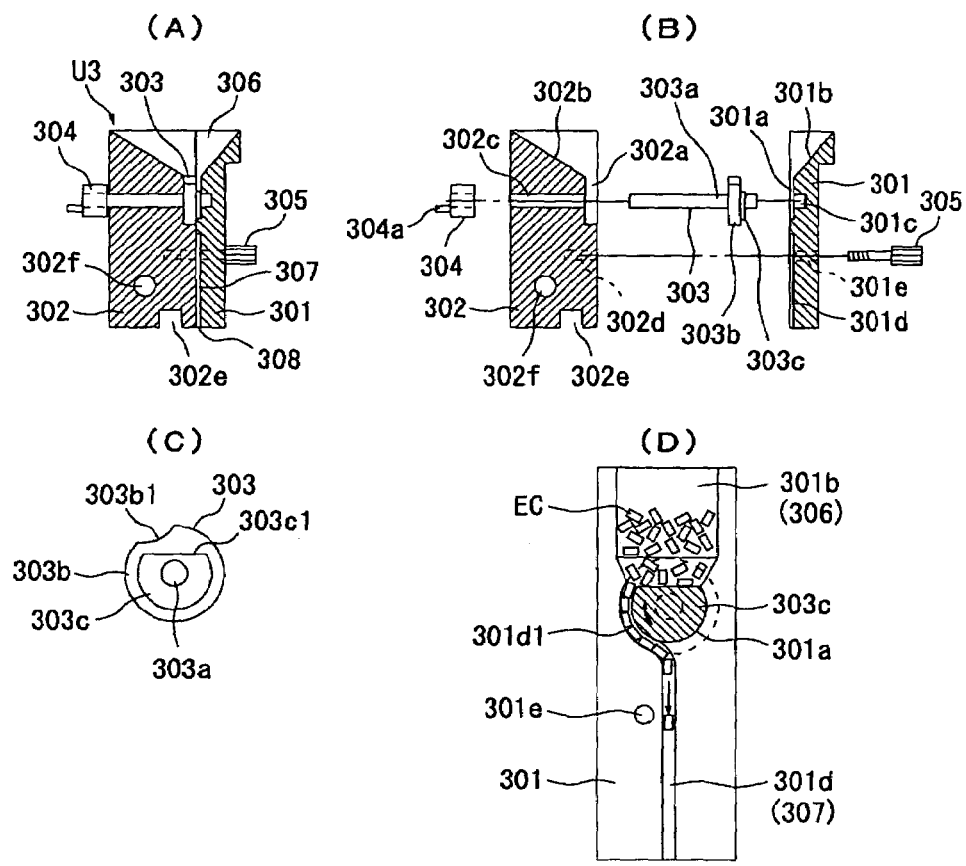
FIGS. 4A to 4D are views showing the construction of the chip component alignment unit shown in FIG. 1.

As shown in FIG. 3, the chip component storage unit U2 comprises a left plate 201, a right plate 202, a front spacer 203, a rear spacer 204, screws 205, a lid 206, a guide shaft 207, a drive ring 208, an upper spring 209, a lower spring 210, a disk drive lever 211, and a screw 212.

At least the left plate 201 out of the left plate 201 and the right plate 202 is transparent, a front spacer 203 and a rear spacer 204 are arranged between the both plates 201, 202, and the left plate 201 and the right plate 202 are fixedly mounted to the front spacer 203 and the rear spacer 204 by means of a plurality of the screws 205. A chip component storage chamber 213 having an inclined bottom surface is defined by a space surrounded by the four chip components, and formed at a top thereof with a chip component supply port 214 and at an underside thereof with an outlet 215. The lid 206 is provided on the chip component supply port 214 to be slidable in the longitudinal direction, and a recess 216, into which an upper portion of the chip component alignment unit U3 described later is to be fitted, is formed below the outlet 215. Also, a screw insertion hole 217 is formed on the left plate 201, the right plate 202, and the front spacer 203 to extend therethrough in a left and right direction, and a similar screw insertion hole 217 is formed on the left plate 201, the right plate 202, and the rear spacer 204.

Also, a C-shaped support frame 201a is formed integrally on the front of a lower portion of the right plate 202 or a lower portion of the front spacer 203, and a guide shaft 207 is mounted vertically on the support frame 201a. The drive ring 208 comprises a cylindrical-shaped member provided on an outer peripheral surface thereof with an annular groove 208a and is vertically movable along the guide shaft 207, of which a central hole is fitted onto the guide shaft 207. The upper spring 209 is arranged above the drive ring 208 and the lower spring 210 is arranged below the drive ring 208 such that the respective springs surround the guide shaft 207. Incidentally, the relationship between forces required for compression of the upper spring 209 and the lower spring 210 is the upper spring 209<the lower spring 210.

The lever 211 is shaped so that a rear portion of a single plate having a predetermined width is twisted 90 degrees to form a horizontal portion, and a substantially central portion thereof is mounted rotatably on a lower portion of the support frame 201a by means of a screw 212. Also, a groove 211a is formed on a rear and horizontal portion of the lever, the groove 211a being inserted into a lower portion of the guide shaft 207, and a portion surrounding the groove bears a lower end of the lower spring 210. That is, when a front portion of the disk drive lever 211 is pushed down to be turned counterclockwise in FIG. 3, a rear and horizontal portion of the lever 211 causes the lower spring 210 and the drive ring 208 to ascend along the guide shaft 207, and the upper spring 209 is compressed with such ascent. When pushing-down of the lever 211 is released, the drive ring 208 and the lower spring 210 return due to the bias of the upper spring 209 and the lever 211 also returns.

The drive unit U1 is mounted to the left side surface of the vertical surface portion of the frame 1 by inserting screws 218 into the two screw insertion holes 217 and screwing the screws into the threaded holes 2 of the frame 1 (see FIG. 1). Incidentally, a top of the drive unit U1 after mount is lower in level than a top of the vertical surface portion of the frame 1, or corresponds substantially to the top of the vertical surface portion of the frame 1.

As shown in FIGS. 4A to 4D, the chip component alignment unit U3 comprises a rear block 301, a front block 302, a disk member 303, an operating member 304, and a joint screw 305.

The rear block 301 comprises a circular recess 301a that rotatably receives a second disk portion 303c described later, an inclined recess 301b contiguous to an upper portion of the circular recess 301a, a journal hole 301c provided centrally of the circular recess 301a, a groove 301d for passage of chip component formed on a front surface of the rear block 301, and a screw insertion hole 301e extending in the longitudinal direction. Formed on an upper portion of the groove 301d for passage of chip component is a curved portion 301d1 extending along an outer periphery of the circular recess 301a, an upper end of the curved portion 301d1 being communicated to the inclined recess 301b. Incidentally, the groove 301d for passage of chip component is rectangular-shaped in cross section, and corresponds in depth to the circular recess 301a.

The front block 302 comprises a circular recess 302a that rotatably receives a first disk portion 303b described later, an inclined recess 302b contiguous to an upper portion of the circular recess 302a, a journal hole 302c provided centrally of the circular recess 302a to extend longitudinally therethrough, and a threaded hole 302d formed in a position to correspond to the screw insertion hole 301e of the rear block 301. A recess 302e, into which a projection 401b of the tube mount unit U4 described later is to be fitted, is formed on an underside of the front block 302, and a screw insertion hole 302f is formed to extend through the front block in the left and right direction.

The disk member 303 comprises a disk shaft 303a, the first disk portion 303b provided on a rear end of the disk shaft 303a, and a second disk portion 303c provided integrally or separately on a rear surface of the first disk portion 303b and having a smaller diameter than that of the first disk portion 303b. A recess 303b1 for agitation is formed on an upper portion of the first disk portion 303b, and an alignment assist surface 303c1 composed of a planar surface or a curved surface is formed on an upper portion of the second disk portion 303c.

The operating member 304 comprises a cylindrical-shaped member provided on a front surface thereof with an eccentric pin 304a. The eccentric pin 304a is inserted into the annular groove 208a of the drive ring 208 on the chip component storage unit U2 and so is slightly smaller in diameter than the annular groove 208a.

When the chip component alignment unit U3 is assembled, a rear projection of the disk shaft 303a of the disk member 303 is inserted into the journal hole 301c of the rear block 301, the second disk portion 303c is inserted into the circular recess 301a of the rear block 301, a front portion of the disk shaft 303a of the disk member 303 is inserted into the journal hole 302c of the front block 302, and the first disk portion 303b is inserted into the circular recess 302a of the front block 302. Then the joint screw 305 is inserted into the insertion hole 301e of the rear block 301 to be screwed into the threaded hole 302d of the front block 302. Thereby, a front flat surface of the rear block 301 and a rear flat surface of the front block 302 come into surface contact with each other, so that the both blocks 301, 302 are joined together. Although not shown, at least a set of a recess and a projection for positioning are provided on the front surface of the rear block 301 and the rear surface of the front block 302, so that when the both blocks are joined together, mutual positioning is performed appropriately by means of the recesses and the projections. Then the operating member 304 is fitted onto a front end of the disk shaft 303a, which projects from the journal hole 302c of the front block 302, and fixed by means of a screw (not shown).

After assembly, an inlet 306 is formed on the chip component alignment unit U3 by the inclined recess 301b of the rear block 301 and the inclined recess 302b of the front block 302, the groove 301d for passage of chip component, closed by the rear surface of the front block 302 defines a chip component passage 307 being rectangular-shaped in cross section and enabling electronic chip component EC to move due to dead weight thereof in a predetermined direction, and an outlet 308 is defined by a lower end of the chip component passage 307.

The chip component alignment unit U3 is mounted to the left side surface of the vertical surface portion of the frame 1 by fitting the upper portion of the chip component alignment unit U3 into the recess 216 of the chip component storage unit U2 and inserting a screw 308 into the screw insertion hole 302f of the chip component alignment unit U3 to screw the same into the threaded hole 3 of the frame 1 (see FIG. 1). In a mount state, the inlet 306 of the chip component alignment unit U3 matches the outlet 215 of the chip component storage unit U2.

Figure 5:
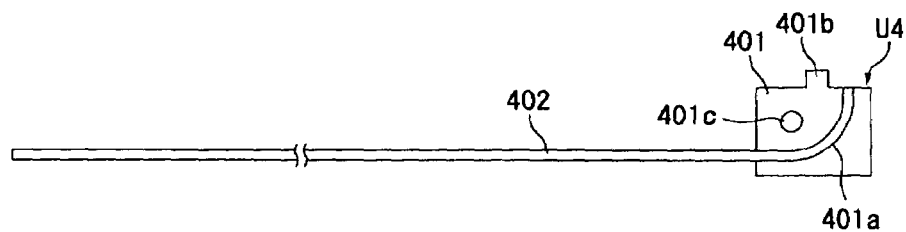
FIG. 5 is a view showing the construction of the tube mount unit shown in FIG. 1.
Figure 6:
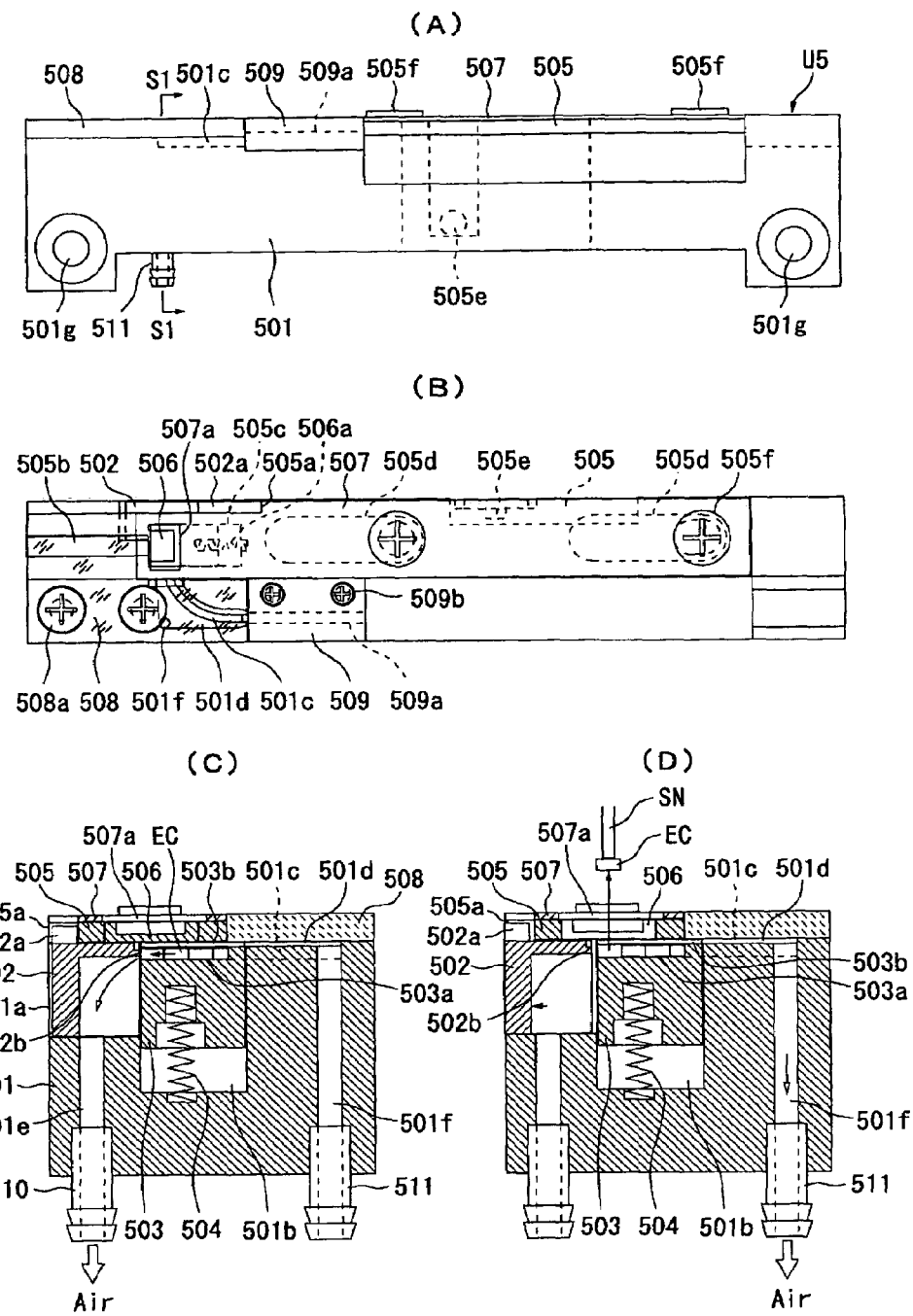
FIGS. 6A to 6D are views showing the construction of the chip component take-out unit shown in FIG. 1.

As shown in FIG. 5, the tube mount unit U4 comprises a unit body 401 and the chip component conveyance tube 402. Here, while the tube mount unit U4 comprises the unit body 401 with the chip component conveyance tube 402 mounted thereto, the tube mount unit U4 may comprise only the unit body 401 and the chip component conveyance tube 402 may be mounted to the unit body 401 afterward in an assembling process.

The unit body 401 is formed on a left surface thereof with a curved groove 401a, which is rectangular-shaped in cross section and has a predetermined curvature, and at a top thereof with a projection 401b, which is to be fitted into the recess 302e of the chip component alignment unit U3. Also, a screw insertion hole 401c is formed in the unit body 401 to extend therethrough in the left and right direction. The chip component conveyance tube 402 is formed from a synthetic resin to be rectangular-shaped in outward appearance, and has inside a passage (without a reference numeral), which is rectangular-shaped in cross section. The tube 402 is bonded with a rear portion thereof inserted into the curved groove 401a of the unit body 401, and a rear end of the tube 402 is substantially in agreement with a top of the unit body 401.

The tube mount unit U4 is mounted to the left side surface of the vertical surface portion of the frame 1 by fitting the projection 401b of the tube mount unit U4 into the recess 302e of the chip component alignment unit U3 and inserting a screw 403 into the screw insertion hole 401c of the tube mount unit U4 to screw the same into the threaded hole 4 of the frame 1 (see FIG. 1). In a mount state, a passage rear end of the chip component conveyance tube 402 of the tube mount unit U4 matches the outlet 308 of the chip component alignment unit U3.

Also, after or before mounting thereto the tube mount unit U4, the chip component conveyance tube 402 is set up in a configuration shown in FIG. 1 with the use of three tube holders 7 and a front end thereof is mounted to the chip component take-out unit U5. Specifically, as shown in FIG. 1, the chip component conveyance tube 402 is arranged in that configuration, in which a first curved portion 402a, a first horizontal portion 402b, a second curved portion 402c, a forward ascending portion 402d, a third curved portion 402e, and a second horizontal portion 402f are lined toward the chip component take-out unit U5 from the chip component alignment unit U3.

In addition, a horizontal state of the first horizontal portion 402b and the second horizontal portion 402f also includes a state near a horizontal. Also, the first curved portion 402a, the second curved portion 402c, and the third curved portion 402e suffice to have such a curvature at inward passage portions thereof as to enable passage therethrough of electronic chip component EC without hindrance, and the curvature has no specific numerical limit. Further, the forward ascending portion 402d may comprise a forwardly ascending, curved portion as well as a forwardly ascending, inclined straight portion as shown in FIG. 1, and in short suffices to comprise such a portion as to cause electronic chip component EC to climb thereon against the dead weight owing to an air flow based on an action of negative pressure. Further, while three tube holders 7 in the figure are used to maintain the chip component conveyance tube 402 in a predetermined configuration, two or less or four or more tube holders 7 may be used to maintain a configuration of the chip component conveyance tube 402.

As shown in FIGS. 6A to 6D, the chip component take-out unit U5 comprises a unit body 501, a stopper 502, a relief member 503, a spring 504, a first shutter 505, a second shutter 506, a shutter cover 507, a transparent cover 508, a tube fixing member 509, a first joint 510, and a second joint 511.

The unit body 501 includes a recess 501a on the right side of a top thereof to arrange therein the stopper 502, and a recess 501b adjacent to the recess 501a to arrange therein the relief member 503. The recess 501b is deeper than the recess 501a and the both recesses 501a, 501b are communicated to each other. Also, the unit body 501 includes on the left of the top thereof a groove 501c for passage of chip component, which is curved 90 degrees as viewed from above and rectangular-shaped in cross section, and grooves 501d for passage of air, which are smaller in depthwise dimension than the groove 501c, on both sides of an upper end of the groove 501c for passage of chip component. The groove 501c for passage of chip component and the grooves 501d for passage of air are covered by the transparent cover 508 to make a chip component passage (referred below to as chip component passage 501c) and an air passage (referred below to as air passage 501d), respectively. Further, an air intake hole 501e is formed in a bottom surface of the recess 501a of the unit body 501, an air intake hole 501f is formed in a bottom surface of the air passage 501d, the first joint 510 is mounted to a lower end of the air intake hole 501e, and the second joint 511 is mounted to a lower end of the air intake hole 501f. Further, screw insertion holes 501g, respectively, are formed on front and rear portions of the unit body 501 to extend therethrough in the left and right direction.

The stopper 502 is arranged in the recess 501a of the unit body 501 and a support shaft (depiction of which is omitted) provided on a rear portion thereof is supported rotatably in a journal hole (depiction of which is omitted) formed in the bottom surface of the recess 501a. Also, a spring (depiction of which is omitted) is provided between a left surface of the stopper 502 and an internal surface of the recess 501a to bias the stopper 502 clockwise as viewed from above. Further, provided on the right of a rear portion of the stopper 502 is an operating projection 502a, against which a corner 505a of the first shutter 505 can abut. Further, a stopper portion 502b composed of minute projections is formed on that portion of the stopper, which is opposed to a tip end of a chip component passage 503 formed on an upper surface of the relief member 503, and the stopper portion 502b is smaller in thicknesswise and widthwise dimensions than the chip component passage 503 and positioned substantially centrally of a depthwise dimension of the chip component passage 503.

The relief member 503 is arranged in the recess 501b of the unit body 501 with the spring 504 therebetween and contacts at its upper surface with the first shutter 505. Also, formed on the upper surface of the relief member 503 is a groove 503a for passage of chip component, which has the same rectangular-shaped cross section as that of the groove 501c for passage of chip component, of the unit body 501 and contiguous to the groove 501c for passage of chip component, and formed on both sides of an upper end of the groove for passage of chip component are grooves 503b for passage of air, which are smaller in depthwise dimension than the groove 503a for passage of chip component and contiguous to the grooves 501d for passage of air, of the unit body 501. The groove 503a for passage of chip component and the grooves 503b for passage of air are covered by the first shutter 505 and the second shutter 506 to make a chip component passage (referred below to as chip component passage 503a) and an air passage (referred below to as air passage 503b), respectively.

The first shutter 505 includes on the right thereof the corner 505a capable of pushing the operating projection 502a of the stopper 502, and on the front thereof a slit 505b for opening of a tip end of the chip component passage 503a. Also, formed on the rear side of the slit 505b of the first shutter 505 is a punched hole 505c having a larger width than that of the slit 505b, and mounted in the punched hole 505c is the second shutter 506, which has the same width as that of the punched hole 505c, in a state of being forwardly biased by a spring 506a. Further, two transversely long guide holes 505d are provided in the first shutter 505. Further, a pin 505e engageable with the engagement groove 105a of the third lever 105 is provided on the right of the first shutter 505. Incidentally, the spring-biased second shutter 506 serves to cancel an action of a force, which is liable to damage electronic chip component EC, on the electronic chip component upon return of the first shutter 505 even in a state, in which a leading electronic part EC stands upright because of vibrations, failure in taking-out, or the like.

The shutter cover 507 includes a rectangular-shaped chip component taking-out port 507a at a front end thereof and two screw insertion holes (without a reference numeral). The shutter cover 507 is mounted to the unit body 501 by inserting screws 505f, which have been inserted into the respective screw insertion holes, into the guide holes 505d of the first shutter 505 and screwing the respective screws 505f into threaded holes (depiction of which is omitted) formed on an upper surface of the unit body 501.

The transparent cover 508 serves to cover the groove 501c for passage of chip component and the grooves 501d for passage of air on an upper surface of the unit body 501, and is mounted to the unit body 501 by inserting screws 508a into respective screw insertion holes (without a reference numeral) to insert the same into threaded holes (depiction of which is omitted) formed on the upper surface of the unit body 501.

The tube fixing member 509 includes at an underside thereof a holding groove 509a that holds a front end of the chip component conveyance tube 402, and is mounted to the unit body 501 by inserting screws 509b into respective screw insertion holes (without a reference numeral) to screw the same into threaded holes (depiction of which is omitted) formed on the upper surface of the unit body 501.

The chip component take-out unit U5 is mounted to the left side surface of the vertical surface portion of the frame 1 by inserting screws 510 into the respective screw insertion holes 501g of the chip component take-out unit U5 put in a state with the tube fixing member 509 removed to screw the same into the threaded holes 5 of the frame 1 (see FIG. 1). In mounting the chip component take-out unit U5 to the left side surface of the vertical surface portion, the pin 505e of the first shutter 505 is caused to engage with the engagement groove 105a of the third lever 105, the tube fixing member 509 inserts the front end of the chip component conveyance tube 402 into the holding groove 509a, and the tube fixing member 509 is mounted to the unit body 501. In a mount state, a front end of a passage of the chip component conveyance tube 402 matches a rear end of the chip component passage 503a of the chip component take-out unit U5. Incidentally, a top of the chip component take-out unit U5 after mount is lower in level than a top of the vertical surface portion of the frame 1, or corresponds substantially to the top of the vertical surface portion of the frame 1.

Figure 7:
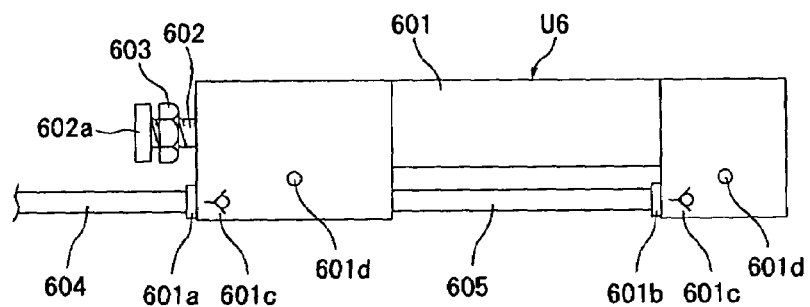
FIG. 7 is a view showing the construction of the negative pressure generation unit shown in FIG. 1.

As shown in FIG. 7, the negative pressure generation unit U6 comprises a unit body 601, a piston rod 602, a nut 603, a first air intake tube 604, and a second air intake tube 605.

An air cylinder and a piston (depiction of which is omitted) are accommodated inside the unit body 601, and the piston rod 602 is connected to the piston. Also, the unit body 601 includes a first air intake port 601a that performs air intake when the piston moves rearward, and a second air intake port 601b that performs air intake when the piston moves forward, the first air intake tube 604 being connected to the first air intake port 601a, and the second air intake tube 605 being connected to the second air intake port 601b. Also, provided inside the respective air intake ports 601a, 601b are check valves 601c that restrict exhaust from the respective air intake ports 601a, 601b. Further, screw insertion holes 601d, respectively, are provided on front and rear portions of the unit body 601. Further, the piston rod 602 includes a large-diameter portion 602a at a front end thereof, and a nut 603 is threaded on a male thread portion formed on the rear of the large-diameter portion.

The negative pressure generation unit U6 is mounted to the left side surface of the vertical surface portion of the frame 1 by inserting screws 606 into the two screw insertion holes 601d to screw the same into the threaded holes 6 of the frame 1 (see FIG. 1). In mounting the negative pressure generation unit U6 to the left side surface of the vertical surface portion of the frame 1, the groove of the grooved connection piece 103e of the first lever 103 of the drive unit U1 is inserted between the large-diameter portion 602a and the nut 603 of the piston rod 602, the nut 603 is rotated to interpose the connection piece 103e of the first lever 103 between the nut 603 and the large-diameter portion 602a, the first air intake tube 604 is connected to the first joint 510 of the chip component take-out unit U5, and the second air intake tube 605 is connected to the second joint 511 of the chip component take-out unit U5.

Subsequently, an operation of the chip components feeding apparatus will be described.

First, the lid 206 of the chip component storage unit U2 is opened, and a multiplicity of electronic chip component with a predetermined shape, for example, electronic chip component EC, which have the relationship of basic dimensions length>width =height, are accommodated into the storage chamber 213 through the chip component supply port 214. Incidentally, the electronic chip component EC include composite chip component such as LC filters, etc., array chip component such as capacitor arrays, inductor arrays, etc., and other kinds of electronic chip component as well as chip chip component such as chip capacitors, chip resistors, chip inductors, etc.

After the chip components are accommodated, the motor 101 of the drive unit U1 rotates the cam plate 102 at a constant speed in a direction indicated by the arrow.

Figure 8:
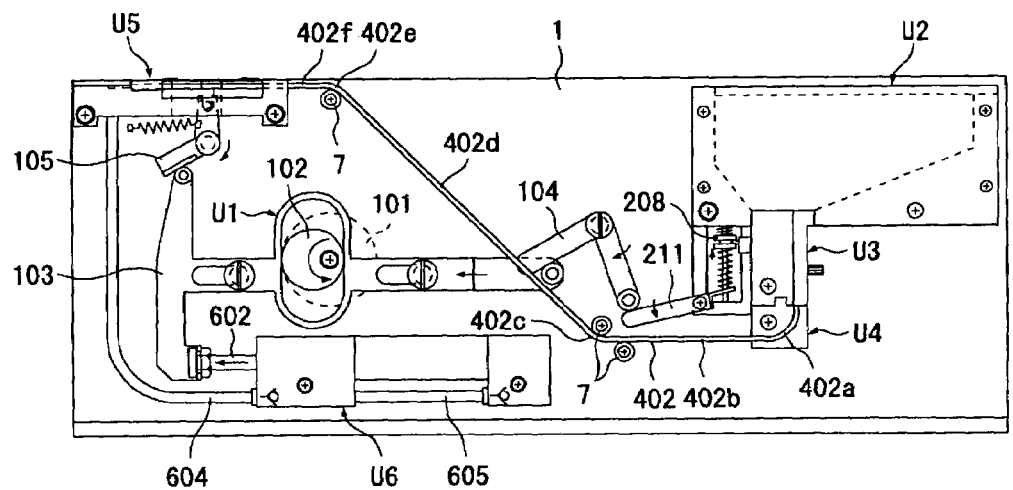
FIG. 8 is a view illustrating an operation of the chip components feeding apparatus shown in FIG. 1.

FIG. 8 shows a state, in which the cam plate 102 has rotated 180 degrees clockwise from a state shown in FIG. 1, and in which an outer peripheral surface of the cam plate 102 pushes an inner surface of the cam hole 101a to thereby move the first lever 103 forward along the guide holes 103b, the roller 107 at the rear end of the first lever 103 pushes a front portion of the second lever 104 to turn the second lever clockwise a predetermined angle about the support shaft 110, and the roller 108 at the front end of the first lever 103 pushes a lower portion of the third lever 105 to turn the third lever clockwise a predetermined angle about the support shaft 111.

When the cam plate 102 rotates 180 degrees further clockwise from a state shown in FIG. 8, the outer peripheral surface of the cam plate 102 pushes the inner surface of the cam hole 101a to thereby move the first lever 103 rearward along the guide holes 103b to return to the state shown in FIG. 1, the second lever 104 is pushed upward by the lever 211 of the chip component storage unit U2 to turn counterclockwise to return to the state shown in FIG. 1, and the third lever 105 is turned counterclockwise by the bias of the spring 112 to return to the state shown in FIG. 1.

That is, the first lever 103, the second lever 104, and the third lever 105 repeat the motions described above according to rotation of the cam plate 102 caused by the motor 101, and a chip component alignment motion, a chip component conveyance motion, and a chip component taking-out motion are realized during such repetition.

In a process, in which the second lever 104 turns clockwise, the roller 109 at a rear end of the second lever 104 pushes the lever 211 of the chip component storage unit U2 downward to turn the lever counterclockwise, the rear and horizontal portion of the lever 211 raises the lower spring 210 and the drive ring 208 against the bias of the upper spring 209, and ascent of the drive ring 208 causes the operating member 304 and the disk member 303 of the chip component alignment unit U3 to rotate a predetermined angle counterclockwise as viewed from the front. Also, in a process, in which the second lever 104 turns counterclockwise, the lever 211 of the chip component storage unit U2 is turned clockwise by the bias of the upper spring 209 to return, the lower spring 210 and the drive ring 208 are caused by the bias of the upper spring 209 to descend, and descent of the drive ring 208 causes the operating member 304 and the disk member 303 of the chip component alignment unit U3 to rotate a predetermined angle clockwise as viewed from the front to return.

As shown in FIG. 4D, since electronic chip component EC in the storage chamber 213 have been taken into the inlet 306 of the chip component alignment unit U3 through the outlet 215 of the chip component storage unit U2, rotation and return of the disk member 303 cause an outer peripheral surface of the first disk portion 303b and the recess 303b1 to agitate the electronic chip component EC to drop the same onto the alignment assist surface 303c1 of the second disk portion 303c due to dead weight, and the electronic chip component EC having dropped onto the alignment assist surface 303c1 undergo an alignment action to be taken lengthwise into an upper end of the chip component passage 307. The electronic chip component EC having been taken lengthwise into the upper end of the chip component passage 307 are downwardly moved due to dead weight in the chip component passage 307 and fed to the rear end of the chip component conveyance tube 402, specifically into the first curved portion 402a of the chip component conveyance tube 402 through the outlet 308.

On the other hand, in a process, in which the first lever 103 retreats from a forward position to return, the piston rod 602 of the negative pressure generation unit U6 retreats from a forward position to permit negative pressure to act on the first joint 510 and the air intake hole 501e of the chip component take-out unit U5 through the first air intake port 601a and the first air intake tube 604, an internal air in the passage of the chip component conveyance tube 402, the chip component passages 501c, 503a, and the air passages 501d, 503b of the chip component take-out unit U5 is taken into the air intake hole 501e through gaps above, below, and left and right of the stopper portion 502b of the stopper 502 by the action of negative pressure as shown in FIG. 6C, and the electronic chip component EC fed into the first curved portion 402a of the chip component conveyance tube 402 are moved forward by the air flow to be fed into the chip component passages 501c, 503a. Such forward movements of the electronic chip component EC are stopped in a position, in which a leading electronic part EC abuts against the stopper portion 502b.

As described above, since the chip component conveyance tube 402 is arranged in a configuration, in which the first curved portion 402a, the first horizontal portion 402b, the second curved portion 402c, the forward ascending portion 402d, the third curved portion 402e, and the second horizontal portion 402f are included toward the chip component take-out unit U5 from the chip component alignment unit U3, the electronic chip component EC fed into the first curved portion 402a are caused by the air flow based on the action of negative pressure to move horizontally forward in the first horizontal portion 402b to be fed to the second curved portion 402c to move forward climbing the forward ascending portion 402d from the second curved portion 402c to be fed to the third curved portion 402e to move horizontally forward in the second horizontal portion 402f from the third curved portion 402e to be fed into the chip component passages 501c, 503a.

Also, in a process, in which the first lever 103 advances from a backward position, the piston rod 602 of the negative pressure generation unit U6 advances from a backward position to permit negative pressure to act on the second joint 511 and the air intake hole 501f of the chip component take-out unit U5 through the second air intake port 601b and the second air intake tube 605, an internal air in the air passages 501d, 503b of the chip component take-out unit U5 is taken into the air intake hole 501f by the action of negative pressure as shown in FIG. 6D, and the electronic chip component EC in the chip component passages 501c, 503a are held by the air flow so as to be immovable in a stop position.

In a process, in which the first lever 103 moves further forward to turn the third lever 105 clockwise, the pin 505e engaged by the engagement groove 105a of the third lever 105 is pushed rearward and the first shutter 505 retreats, so that as shown in FIG. 6D, the slit 505b is positioned below the chip component taking-out port 507a of the shutter cover 507 to permit at least a leading electronic part EC in the chip component passage 503a to be exposed outside through the chip component taking-out port 507a, and the stopper 502 having been released from push by the first shutter 505 is rotated slightly clockwise by the bias of the spring as viewed from above to cause the stopper portion 502b to separate slightly from the relief member 503 (a leading electronic part EC).

Electronic chip component EC are taken out from the chip components feeding apparatus in this timing, specifically, taken outside by lowering a suction nozzle SN capable of going up and down, to attract a leading electronic part EC through the chip component taking-out port 507a and the slit 505b and then raising the suction nozzle SN.

In this manner, with the chip components feeding apparatus shown in FIGS. 1 to 8, since the chip component conveyance tube 402 is arranged in a configuration, in which the first curved portion 402a, the first horizontal portion 402b, the second curved portion 402c, the forward ascending portion 402d, the third curved portion 402e, and the second horizontal portion 402f are included toward the chip component take-out unit U5 from the chip component alignment unit U3, the electronic chip component EC fed into the first curved portion 402a are caused by the air flow based on the action of negative pressure to move horizontally forward in the first horizontal portion 402b to be fed to the second curved portion 402c to move forward climbing the forward ascending portion 402d from the second curved portion 402c to be fed to the third curved portion 402e to move horizontally forward in the second horizontal portion 402f from the third curved portion 402e to be fed into the chip component passages 501c, 503a.

That is, since the chip component conveyance tube 402 is provided with the ascending portion 402d, which electronic chip component EC are caused by the air flow based on the action of negative pressure to move climbing against dead weight, it is possible to restrict a pushing force applied to electronic chip component EC forwardly of electronic chip component EC in the ascending portion 402a, which are acted by dead weight, to lessen a push load applied to a leading electronic part EC from succeeding electronic chip component EC even in the case where a residual pressure phenomenon occurs in a conveyance passage including the chip component conveyance tube 402 when the action of negative pressure is released. Therefore, even in the case where a residual pressure phenomenon occurs in a conveyance passage including the chip component conveyance tube 402, it is possible to lessen a push load applied to a leading electronic part EC from succeeding electronic chip component EC to enable favorably taking out a leading electronic part EC with the suction nozzle SN.

Also, since a push load applied to a leading electronic part EC from succeeding electronic chip component EC can be lessened, it is possible to exactly carry out a method of separating the stopper portion 502b slightly from a leading electronic part EC when the suction nozzle SN is used to take out the leading electronic part EC from the chip component taking-out port 507a, and a method of holding succeeding electronic chip component EC so as to make the same immovable, so that it is possible to favorably perform taking-out of the leading electronic part EC with the suction nozzle SN.

Further, in cooperation with the arrangement and configuration of the chip component conveyance tube 402, the drive unit U1, the chip component storage unit U2, the chip component alignment unit U3, the tube mount unit U4, the chip component take-out unit U5, and the negative pressure generation unit U6 can be mounted to the frame 1 so as not to project from front, rear, upper and lower ends of the frame 1, application to a chip component mounting machine capable of only mounting and dismounting a chip components feeding apparatus called a modular feeder is adequately made possible, it is possible to simply cope with the case where a space for mounting of a chip components feeding apparatus itself is restricted because any portion or portions projecting from front, rear, upper and lower ends of the frame 1 are absent, and it is possible to beforehand avoid such a situation, in which a worker strikes a hand or the like against a projecting portion to be injured.

Figure 9:
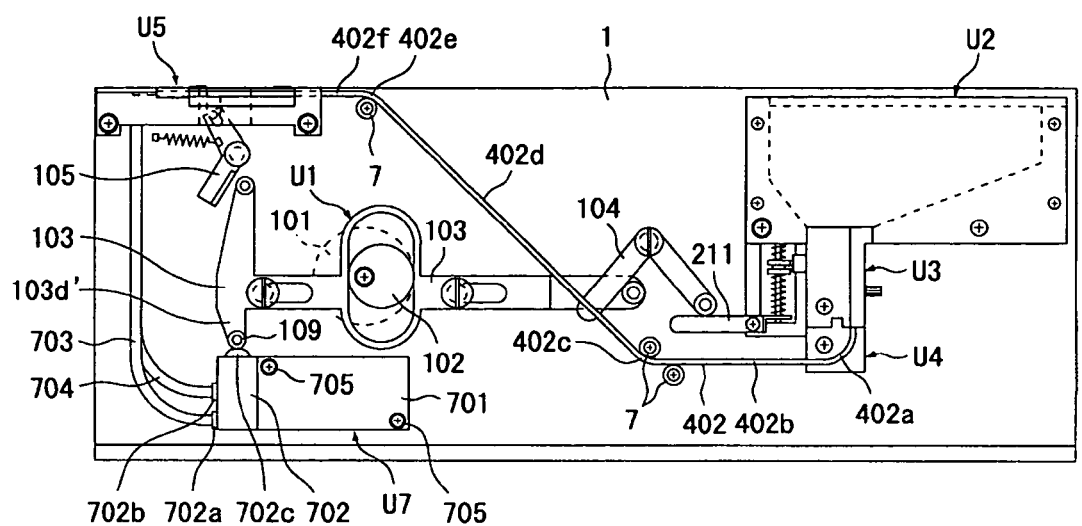
FIG. 9 is a left side view showing a chip components feeding apparatus according to a modification of the chip components feeding apparatus shown in FIG. 1.

FIG. 9 shows a modification of the chip components feeding apparatus described above, which modification is mainly different from the chip components feeding apparatus described above in that a negative pressure generation unit U7 with an electrically-driven vacuum pump as a negative pressure generation source is used in place of the negative pressure generation unit U6 with an air cylinder as a negative pressure generation source.

The negative pressure generation unit U7 comprises a unit body 701, a port change-over part 702, a first air intake tube 703, and a second air intake tube 704. The electrically-driven vacuum pump (depiction of which is omitted) is accommodated in the unit body 701, and the port switching part 702 includes a valve mechanism (depiction of which is omitted) that performs selective connection and switching between a first air intake port 702a, a second air intake port 702b, and an air intake port of the electrically-driven vacuum pump, and a change-over switch 702c that performs a change-over operation of the valve mechanism. The first air intake tube 703 is connected to the first air intake port 702a of the port change-over part 702, and the second air intake tube 704 is connected to the second air intake port 601b. Incidentally, the change-over switch 702c is operated by a roller 109 provided on a portion 103d' provided on a lower side of a front end of a first lever 103 of the drive unit U1. Further, screw insertion holes (without a reference numeral), respectively, are provided on front and rear portions of the unit body 701.

The negative pressure generation unit U7 is mounted to the left side surface of the vertical surface portion of the frame 1 by inserting screws 705 into two screw insertion holes to screw the same into threaded holes (depiction of which is omitted) of the frame 1. In mounting the negative pressure generation unit U7 to the left side surface of the vertical surface portion of the frame 1, the first air intake tube 703 is connected to the first joint 510 of the chip component take-out unit U5 and the second air intake tube 704 is connected to the second joint 511 of the chip component take-out unit U5.

A chip component alignment motion and a chip component conveyance motion in the chip components feeding apparatus with the use of the negative pressure generation unit U7 are the same as those in the chip components feeding apparatus described above except the following point.

That is, in a process, in which the first lever 103 retreats from a forward position to return, the change-over switch 702c of the negative pressure generation unit U7 is changed over by the roller 109 on the first lever 103 to cause negative pressure to act on the first joint 510 and the air intake hole 501e of the chip component take-out unit U5 through the first air intake port 702a and the first air intake tube 703, an internal air in the passage of the chip component conveyance tube 402, and the chip component passages 501c, 503a and the air passages 501d, 503b of the chip component take-out unit U5 is taken into the air intake hole 501e by the action of negative pressure through gaps above, below, and left and right of the stopper portion 502b of the stopper 502 as shown in FIG. 6C, and electronic chip component EC fed into the first curved portion 402a of the chip component conveyance tube 402 are moved forward by the air flow to be fed into the chip component passages 501c, 503a.

Also, in a process, in which the first lever 103 advances from a backward position, the change-over switch 702c of the negative pressure generation unit U7 is changed over by the roller 109 on the first lever 103 to cause negative pressure to act on the second joint 511 and the air intake hole 501f of the chip component take-out unit U5 through the second air intake port 702b and the second air intake tube 704, an internal air in the air passages 501d, 503b of the chip component take-out unit U5 is taken into the air intake hole 501f by the action of negative pressure as shown in FIG. 6D, and the electronic chip component EC in the chip component passages 501c, 503a are held by the air flow so as to be immovable in a stop position.

In this manner, with the chip components feeding apparatus shown in FIG. 9, since the negative pressure generation unit U7 with an electrically-driven vacuum pump as a negative pressure generation source is used, there is an advantage that it is possible to electrically and optionally set a magnitude of negative pressure conformed to a size of electronic chip component EC to be conveyed and specifications such as a shape of the passage of the chip component conveyance tube 402, or the like, and a magnitude of negative pressure suited to conveyance of electronic chip component EC in the case where the chip component conveyance tube 402 is provided with the forward ascending portion 402d. Other function and effect are the same as those of the chip components feeding apparatus shown in FIGS. 1 to 8.

What is claimed is:

1. A chip components feeds apparatus that aligns chip component having a predetermined shaped that are loaded into said feeding apparatus in bulk, said chip components feeding apparatus conveying the chip component to a pre-determined take-out position as an abutted series of chip components through a chip component conveyance tube under the periodic application and release of negative pressure, the negative pressure being generated from a negative pressure generation source connected to the chip component conveyance tube, wherein the chip component conveyance tube is provided with an ascending portion oriented such that the negative pressure causes said chip component to climb against dead weight during at least a portion of said conveying.

2. The chip components feeds apparatus according to claim 1, wherein the chip component conveyance tube connects between an outlet of a chip component alignment unit functioning to align chip components, which have a predetermined shape and are put in a bulk state, in a predetermined orientation to discharge the same from the outlet due to dead weight, and a rear end of an internal chip component passage of a chip component take-out functioning to stop chip component supplied to the chip component passage in an aligned state to exposed a leading part outside through a chip component take-out outlet, and the chip component conveyance tube is arranged in that configuration, in which a first curved portion, a first horizontal portion, a second curved portion, a forward ascending portion, a third curved portion, and a second horizontal portion are included toward the chip component take-out unit from the chip component alignment unit.

3. The chip components feeding apparatus according to claim 2, wherein the chip component conveyance tube is held in a predetermined orientation by a plurality of tube holders.

4. The chip components feeding apparatus according to claim 2, wherein a negative pressure generation source for generation of the action of negative pressure comprises an electrically-driven vacuum pump.

5. The chip components feeding apparatus according to claim 1, wherein the chip component conveyance tube is held in a predetermined orientation by a plurality of tube holders.

6. The chip components feeding apparatus according to claim 5, wherein a negative pressure generation source for generation of the action of negative pressure comprises an electrically-driven vacuum pump.

7. The chip components feeding apparatus according to claim 1, wherein the negative pressure generation source for generation of the action of negative pressure comprises an electrically-driven vacuum pump.

* * * * *